US010152100B2

(12) United States Patent
Ahrens et al.

(10) Patent No.: US 10,152,100 B2
(45) Date of Patent: Dec. 11, 2018

(54) RETRACTABLE HEAT EXCHANGER

(71) Applicant: Intel Corporation, Santa Clara, CA (US)

(72) Inventors: Michael Ahrens, San Jose, CA (US); George H. Daskalakis, Forest Grove, OR (US); Steven J. Lofland, Portland, OR (US); David Pidwerbecki, Hillsboro, OR (US); Bo Qiu, Hillsboro, OR (US); James C. Raupp, Hillsboro, OR (US); Stacy L. Yee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/200,614

(22) Filed: Jul. 1, 2016

(65) Prior Publication Data
US 2018/0004261 A1    Jan. 4, 2018

(51) Int. Cl.
*G06F 1/20* (2006.01)
*H05K 7/20* (2006.01)
*H01L 23/367* (2006.01)
*G06F 1/32* (2006.01)
*G06F 1/16* (2006.01)

(52) U.S. Cl.
CPC ............. *G06F 1/206* (2013.01); *G06F 1/203* (2013.01); *G06F 1/3203* (2013.01); *G06F 1/3234* (2013.01); *H01L 23/367* (2013.01); *H05K 7/2039* (2013.01); *H05K 7/20127* (2013.01); *H05K 7/20154* (2013.01); *G06F 1/1632* (2013.01)

(58) Field of Classification Search
CPC ...................... G06F 1/1632; G06F 1/20–1/206
See application file for complete search history.

(56) References Cited

U.S. PATENT DOCUMENTS

| | | | | |
|---|---|---|---|---|
| 5,808,869 A * | 9/1998 | Donahoe | ................... | H05K 7/20 174/15.2 |
| 6,058,009 A * | 5/2000 | Hood, III | ................ | G06F 1/203 361/679.47 |
| 6,104,607 A * | 8/2000 | Behl | ....................... | G06F 1/203 165/80.3 |
| 6,181,554 B1 * | 1/2001 | Cipolla | ................. | G06F 1/1616 361/679.02 |
| 7,301,765 B2 * | 11/2007 | Huang | .................... | G06F 1/203 361/679.48 |
| 7,321,491 B2 * | 1/2008 | Long | ....................... | G06F 1/203 165/104.33 |

(Continued)

*Primary Examiner* — Robert J Hoffberg
(74) *Attorney, Agent, or Firm* — Jaffery Watson Mendonsa & Hamilton LLC

(57) ABSTRACT

In one example an electronic device comprises a chassis, a processing device disposed in the chassis, a first heat spreader positioned adjacent the processing device and in thermal communication with the processing device, and a second heat spreader positioned adjacent the first heat spreader and in thermal communication with the first heat spreader. In some examples the second heat spreader is moveable between a first position in which the second heat spreader is disposed within the chassis and a second position in which at least a portion of the second heat spreader extends outside the chassis. Other examples may be described.

16 Claims, 14 Drawing Sheets

(56) References Cited

U.S. PATENT DOCUMENTS

| | | | | |
|---|---|---|---|---|
| 7,472,215 | B1* | 12/2008 | Mok | G06F 1/1632 |
| | | | | 165/80.3 |
| 7,551,438 | B2* | 6/2009 | Seki | H05K 7/20772 |
| | | | | 165/80.4 |
| 7,806,531 | B2* | 10/2010 | Zakoji | G03B 21/16 |
| | | | | 165/104.33 |
| 7,948,750 | B2* | 5/2011 | Hung | G06F 1/203 |
| | | | | 165/185 |
| 8,214,086 | B2* | 7/2012 | Thompson | G06F 1/206 |
| | | | | 700/275 |
| 8,693,196 | B2* | 4/2014 | Wu | G06F 1/182 |
| | | | | 361/679.47 |
| 8,713,956 | B2* | 5/2014 | Couto | G06F 1/1632 |
| | | | | 165/80.2 |
| 2007/0041157 | A1* | 2/2007 | Wang | G06F 1/203 |
| | | | | 361/679.54 |
| 2010/0214735 | A1* | 8/2010 | Huang | G06F 1/203 |
| | | | | 361/679.47 |
| 2010/0296250 | A1* | 11/2010 | Huang | H05K 7/20518 |
| | | | | 361/700 |
| 2011/0075360 | A1* | 3/2011 | Tomioka | G06F 1/20 |
| | | | | 361/695 |
| 2012/0293952 | A1* | 11/2012 | Herring | H01L 23/367 |
| | | | | 361/679.54 |
| 2013/0027877 | A1* | 1/2013 | Yang | G06F 1/203 |
| | | | | 361/692 |
| 2016/0085273 | A1* | 3/2016 | Delano | G06F 1/182 |
| | | | | 361/679.11 |
| 2016/0179147 | A1* | 6/2016 | Burr | G06F 1/203 |
| | | | | 361/679.54 |
| 2016/0179149 | A1* | 6/2016 | Valavi | G06F 1/206 |
| | | | | 361/679.54 |

* cited by examiner

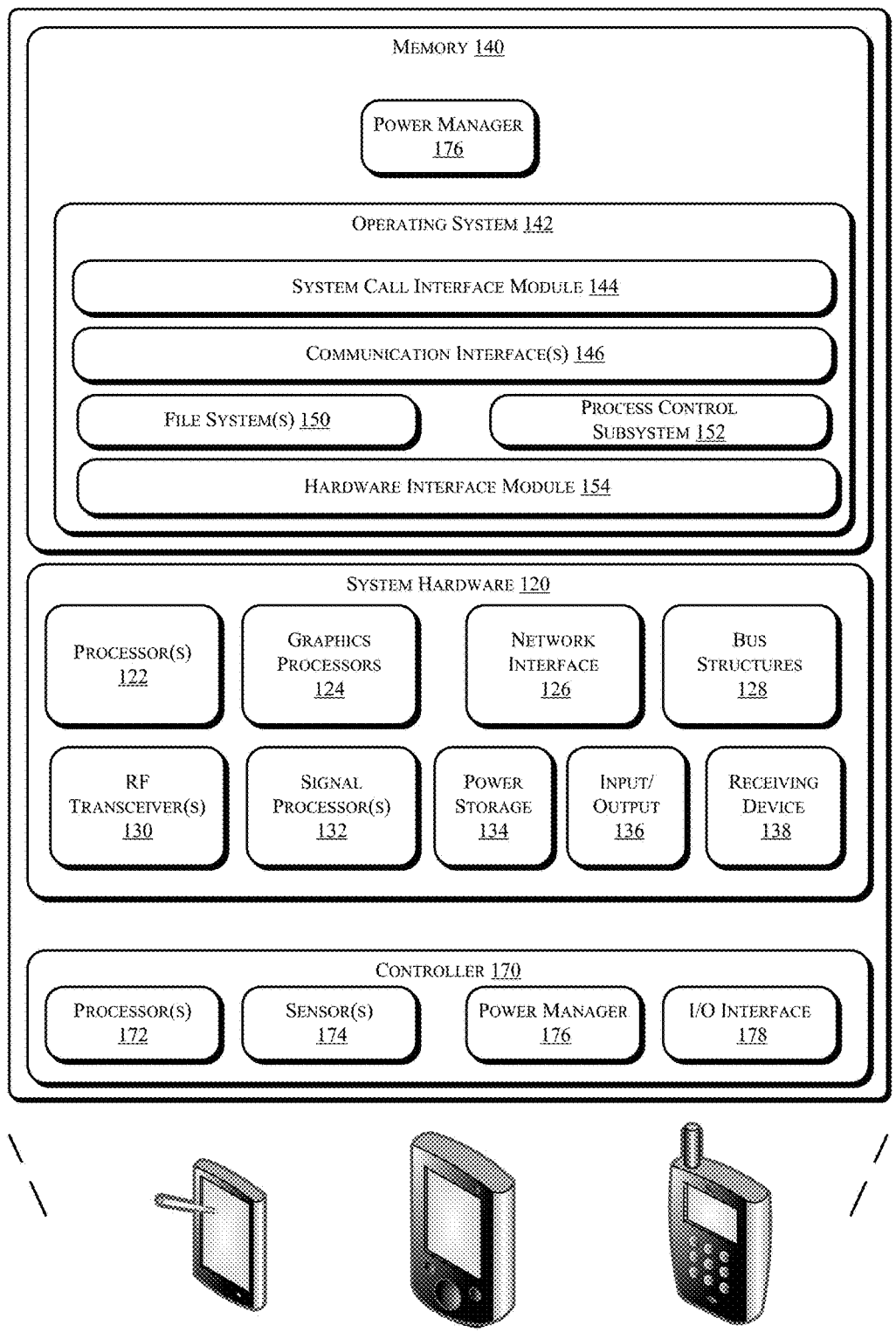
FIG. 1     ELECTRONIC DEVICE 100

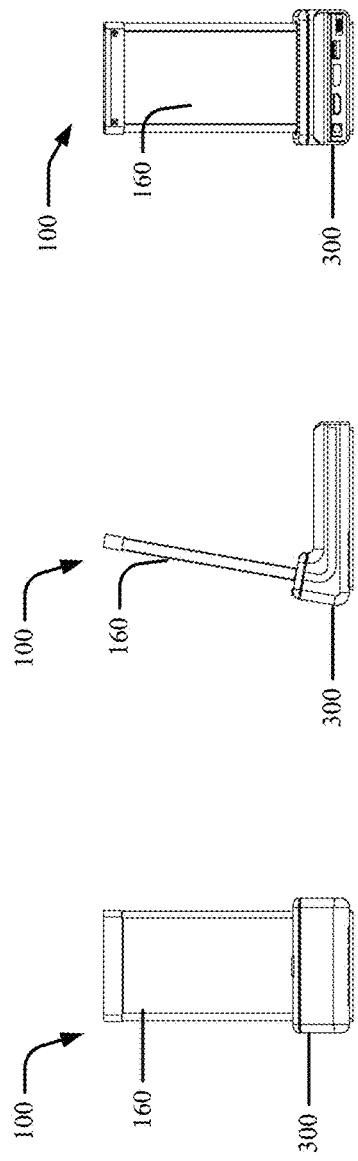

RETRACTABLE HEAT EXCHANGER

BACKGROUND

The subject matter described herein relates generally to the field of electronic devices and more particularly to a retractable heat exchanger.

Electronic devices, e.g., computers, mobile phones, tablets, electronic readers, and the like include components which generate heat which, in turn, must be dissipated from the device chassis. Computer systems have employed active heat dissipation systems such as fans and blowers to dissipate heat from the chassis. However, many thin form factor electronic devices rely on passive heat dissipation systems, e.g., heat spreaders, to dissipate heat from electronic components in the device. Heat dissipation efficiency is a limiting factor in managing the operating power of electronic devices. Accordingly, heat exchangers may find utility, e.g., in design and construction of electronic devices.

BRIEF DESCRIPTION OF THE DRAWINGS

The detailed description is described with reference to the accompanying figures.

FIG. 1 is a schematic illustration of an electronic device which may be adapted to implement a retractable heat exchanger in accordance with some examples.

FIGS. 3A-3E are various views of an electronic device coupled to a docking station in accordance with some examples.

DETAILED DESCRIPTION

Figure 2A:
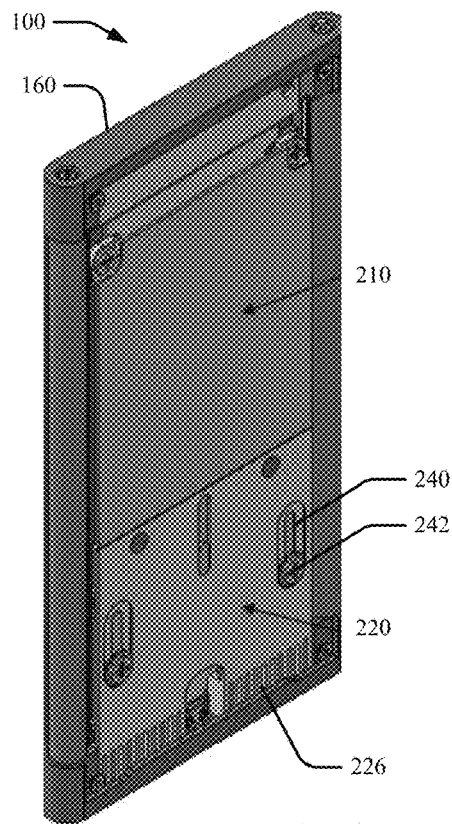
FIGS. 2A-2G are various views of an electronic device which may be adapted to include a retractable heat exchanger in accordance with some examples.

Described herein are exemplary systems and methods to implement a retractable heat exchanger in electronic devices. In the following description, numerous specific details are set forth to provide a thorough understanding of various examples. However, it will be understood by those skilled in the art that the various examples may be practiced without the specific details. In other instances, well-known methods, procedures, components, and circuits have not been illustrated or described in detail so as not to obscure the particular examples.

As described above, it may be useful to provide an electronic device with a retractable heat exchanger and techniques to manage power settings of components of the electronic device based on heat dissipation properties of the heat exchanger. Subject matter described herein addresses this and other issues by providing an electronic device with a chassis, a processing device disposed in the chassis, a first heat spreader positioned adjacent the processing device and in thermal communication with the processing device, and a second heat spreader positioned adjacent the first heat spreader and in thermal communication with the first heat spreader. The second heat spreader is moveable between a first position in which the second heat spreader is disposed within the chassis and a second position in which at least a portion of the second heat spreader extends outside the chassis.

In some examples a controller in the electronic device includes logic a thermal management module comprising logic, at least partially including hardware logic, to manage operating parameters of the electronic device based at least in part on whether the second heat spreader is in the first position or the second position.

Additional features and operating characteristics of the electronic device and associated system are described below with reference to FIGS. 1-10.

FIG. 1 is a schematic illustration of an electronic device 100 which may be adapted to include one or more retractable heat exchangers in accordance with some examples. In various examples, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 100 includes system hardware 120 and memory 140, which may be implemented as random access memory and/or read-only memory. A file store may be communicatively coupled to electronic device 100. The file store may be internal to electronic device 100 such as, e.g., eMMC, SSD, one or more hard drives, or other types of storage devices. Alternatively, the file store may also be external to electronic device 100 such as, e.g., one or more external hard drives, network attached storage, or a separate storage network.

System hardware 120 may include one or more processors 122, graphics processors 124, network interfaces 126, and bus structures 128. In one embodiment, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/ GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIM-bus®), or the like.

Electronic device 100 may include an RF transceiver 130 to transceive RF signals, and a signal processing module 132 to process signals received by RF transceiver 130. RF transceiver may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more power storage devices 134, e.g., batteries, and one or more sensors 136 such as a thermal sensor, a coupling sensor, or the like. Electronic device 100 may further include one or more input/output interfaces 138 such as, e.g., a keypad and/or a display. In some examples electronic device 100 may not have a keypad and use the touch panel for input.

Memory 140 may include an operating system 142 for managing operations of electronic device 100. In one embodiment, operating system 142 includes a hardware interface module 154 that provides an interface to system hardware 120. In addition, operating system 140 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 140. Operating system 142 may be embodied as a UNIX operating system or any derivative thereof (e.g., Linux, Android, etc.) or as a Windows® brand operating system, or other operating systems.

In some examples an electronic device may include a controller 170, which may comprise one or more controllers that are separate from the primary execution environment. The separation may be physical in the sense that the controller may be implemented in controllers which are physically separate from the main processors. Alternatively, the trusted execution environment may logical in the sense that the controller may be hosted on same chip or chipset that hosts the main processors.

By way of example, in some examples the controller 170 may be implemented as an independent integrated circuit located on the motherboard of the electronic device 100, e.g., as a dedicated processor block on the same SOC die. In other examples the trusted execution engine may be implemented on a portion of the processor(s) 122 that is segregated from the rest of the processor(s) using hardware enforced mechanisms In the embodiment depicted in FIG. 1 the controller 170 comprises a processor 172, a sensor 174, a power manager 176, and an I/O interface 178. In some examples sensor(s) 174 may include a wireless communication capability to detect the presence of electronic device 100. Alternatively, sensor(s) 174 may comprise one or more of an optical sensor which detects the presence of electronic device 100 or a pressure sensor to detect the positioning of electronic device 100 on charger 200. The I/O module 178 may comprise a serial I/O module or a parallel I/O module. Because the controller 170 is separate from the main processor(s) 122 and operating system 142, the controller 170 may be made secure, i.e., inaccessible to hackers who typically mount software attacks from the host processor 122.

In some examples portions of the power manager 176 may reside in the memory 140 of electronic device 100 and may be executable on one or more of the processors 122. For example, portions of the power manager may be accessible through the basic input/output system (BIOS) of the electronic device 100.

Structural aspects of a retractable heat exchanger for an electronic device will be explained with reference to FIGS. 2A-2E. The examples depicted herein represent a handheld electronic device. However, it will be recognized that the subject matter described herein applies equally to other electronic devices.

In some examples an electronic device 100 may comprise a chassis 160 formed from a suitably rigid material, e.g., a suitable polymer, metal, or composite material, or combinations thereof. The chassis 160 may be formed as a unitary structure or may be formed from multiple different sections connected by suitable fasteners.

Electronic device 100 may comprise one or more processing devices 122 or other electronic components disposed in the chassis, typically mounted on a circuit board 121. In accordance with principles described herein, electronic device 100 may further comprise a first heat spreader 210 positioned adjacent the processing device 122 and in thermal communication with the processing device 122. In some examples the first heat spreader 210 may be mounted to the chassis 160 in such a way that the first heat spreader 210 makes direct physical contact with the processing device 112. A thermally interface material (TIM) may be applied between the processing device 122 and the heat spreader 210 to facilitate heat transfer from the processing device 122 to the first heat spreader 210.

Electronic device 100 may further comprise a second heat spreader 220 positioned adjacent the first heat spreader 210 and in thermal communication with the first heat spreader. In some examples the second heat spreader 220 is moveable between a first position (FIG. 2A, 2D) in which the second heat spreader 220 is disposed within the chassis 160 and a second position (FIG. 2B, 2C, 2E) in which at least a portion of the second heat spreader 220 extends outside the chassis 160.

In some examples the second heat spreader 220 comprises a plate section 222 which may be physically coupled to the first heat spreader 210 and a heat exchange block 224 depending from the plate section 222. The heat exchange block 224 may comprise a plurality of fins 226 (FIG. 2B, 2C) defining a plurality of apertures 228 to permit airflow passage between the fins 226. The second heat spreader 220 may further comprise a base plate 230 depending from the heat exchange block 224.

Figure 2B:
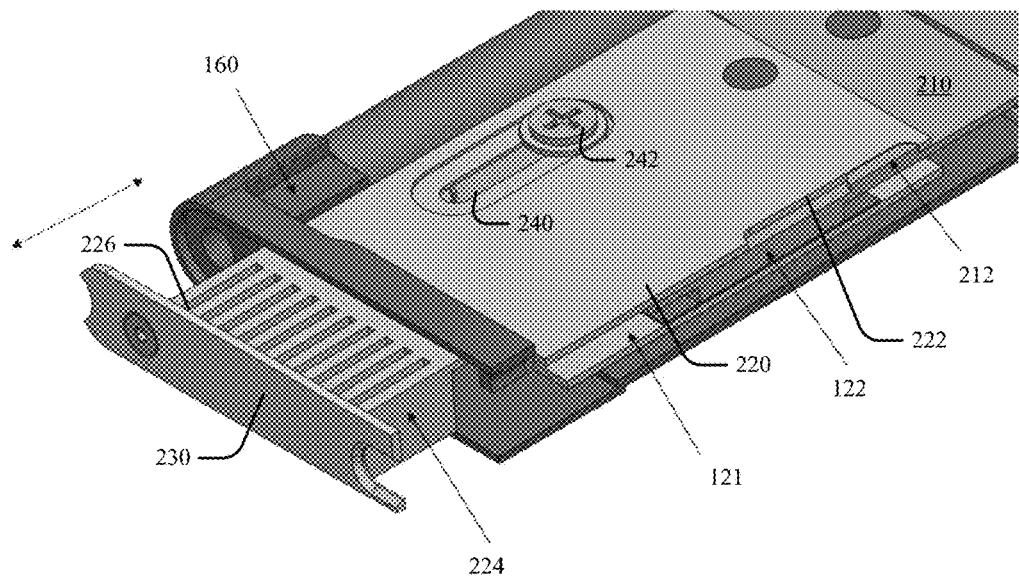

In some examples one or more alignment features may be included to facilitate alignment between the first heat spreader 210 and the second heat spreader 220. Referring to FIG. 2B, in some examples the first heat spreader 210 comprises a tab 212 and the second heat spreader 220 comprises an alignment slot 222 to receive the tab 212 to facilitate alignment between the first heat spreader 210 and the second heat spreader 220. In further examples the second heat spreader 220 may comprise one or more slots 240 through which a screw 242 passes. Screw 242 may be secured to the first heat spreader 210. The length of slot 240 delimits the range of motion of the second heat spreader 220. Further, in some examples the first heat spreader 210 and the second heat spreader 220 may comprise one or more magnets 236 to facilitate alignment between the first heat spreader 210 and the second heat spreader 220.

The first heat spreader 210 and the second heat spreader 220 may be formed from suitable heat conductive materials, e.g., a suitable metal material or a composite. Further, a thermal interface material (TIM), conductive grease, or other material to promote thermal conductivity between the two spreaders may be positioned between the first heat spreader 210 and the second heat spreader 220 to facilitate heat transfer there between.

Referring to FIGS. 3A-3E, in some examples the electronic device 100 may be positioned in a docking station 300. Docking station 300 may comprise one or more airflow devices configured to force air through the apertures 228 in the heat exchange block 224 of the second heat spreader 220 when the electronic device 100 is positioned within docking station 300.

Figure 2C:
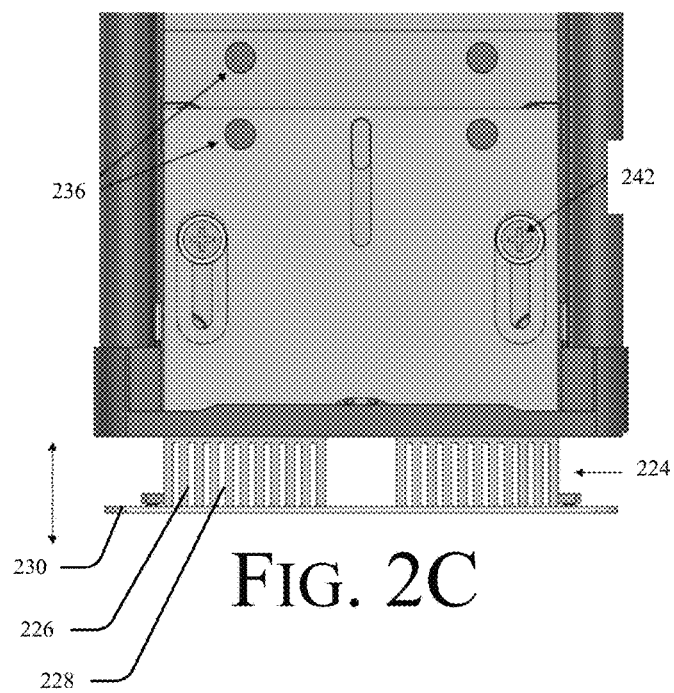
Figure 4:
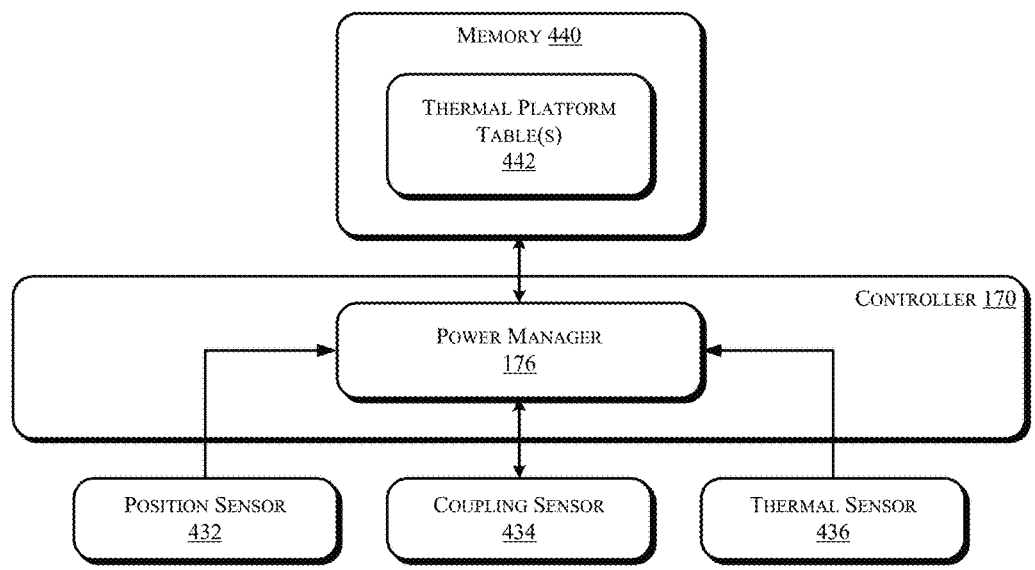
FIG. 4 is a schematic illustration of an architecture to manage operations of an electronic device which includes a retractable heat exchanger in accordance with some examples.
Figure 2D:
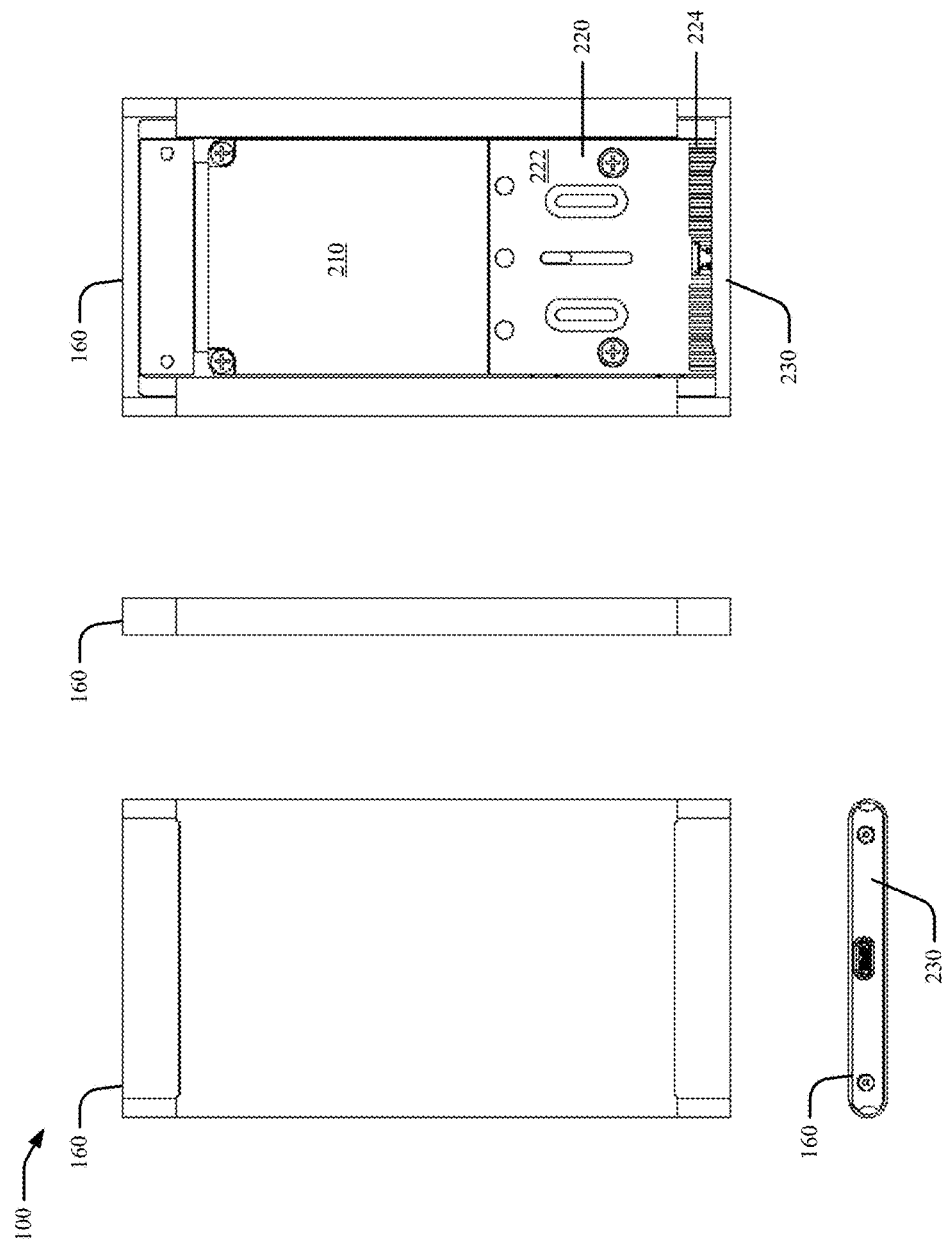
Figure 2E:
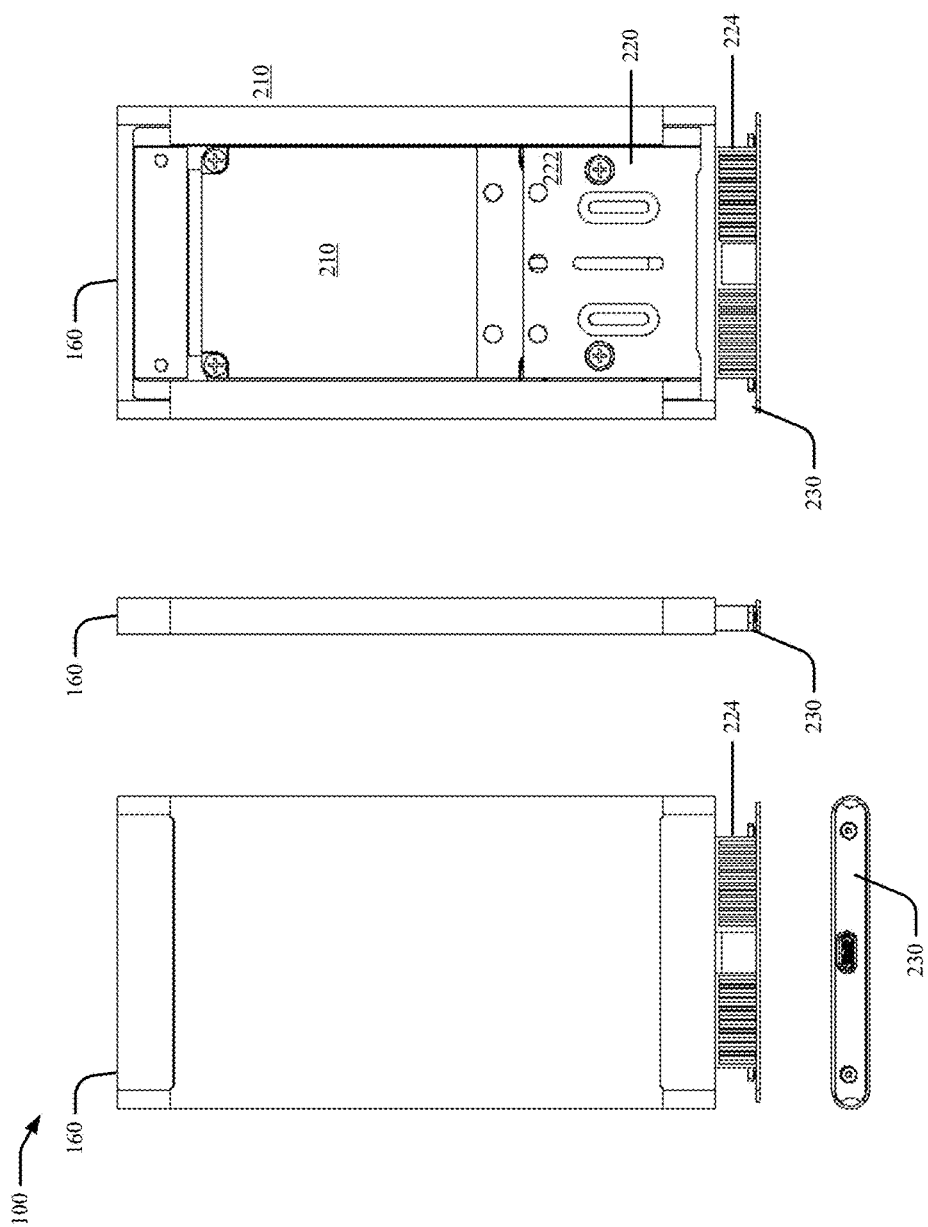
Figure 2F:
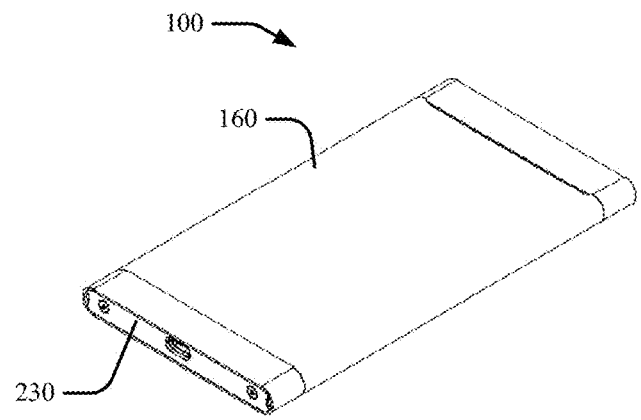
Figure 2G:
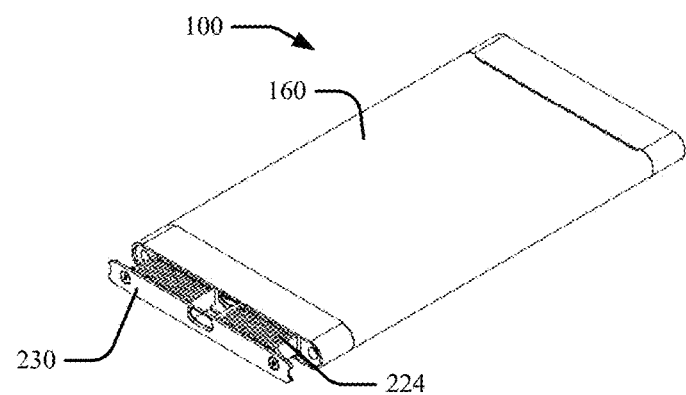

Referring to FIG. 4, the power manager 176 may be one component of an architecture which is capable to manage operating parameters of the electronic device 100 based at least in part on the position of the second heat spreader 220. In some examples the power manager 176 may be communicatively coupled to a position sensor 432 capable to determine whether the second heat spreader is in the first position in which the heat exchange block 224 is within the chassis 160 (FIG. 2A, 2D) or in the second position in which the heat exchange block 224 is outside the chassis 160 (FIG. 2B, 2C, 2D). The power manager 176 may be communicatively coupled to a coupling sensor 434 capable to determine whether the electronic device is coupled to a docking station 300 (FIGS. 3A-3E) and/or to one or more thermal sensors 436 capable to detect a temperature in the chassis 160 of the electronic device.

Further, the power manager 176 may be communicatively coupled to a memory 440 which comprises one or more thermal platform tables 442 which specify operating parameters (e.g., power settings, processor speeds, display settings, etc.) for the electronic device 100. For example, thermal platform tables 442 may comprise a native thermal platform table which designates operating parameter for the electronic device 100 and which may be retrieved from memory 440 by the basic input/output system (BIOS) of electronic device 100 when the device is booted. Thermal platform tables 442 may include additional tables which may be invoked during operation of the electronic device 100.

In some examples the power manager 176 interacts with one or more other components of the electronic device 100 to manage power operations of one or more components of the electronic device 100 based at least in part on the position of the second heat spreader 220. In some examples the processor 122 is capable to switch between a first operating power state when the second heat spreader 220 is in the first position an a second operating power state when the second heat spreader 220 is in the second position.

Figure 5A:
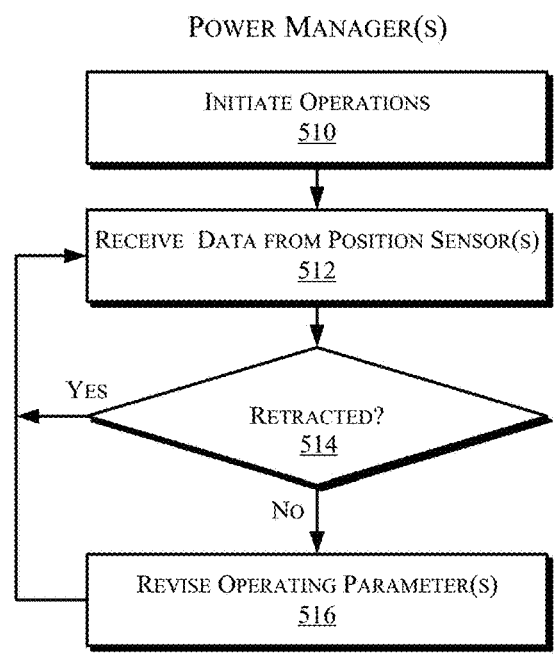
FIGS. 5A and 5B are flowcharts illustrating operations in a method to operate an electronic device which includes a retractable heat exchanger in an electronic device in accordance with some examples.
Figure 5B:
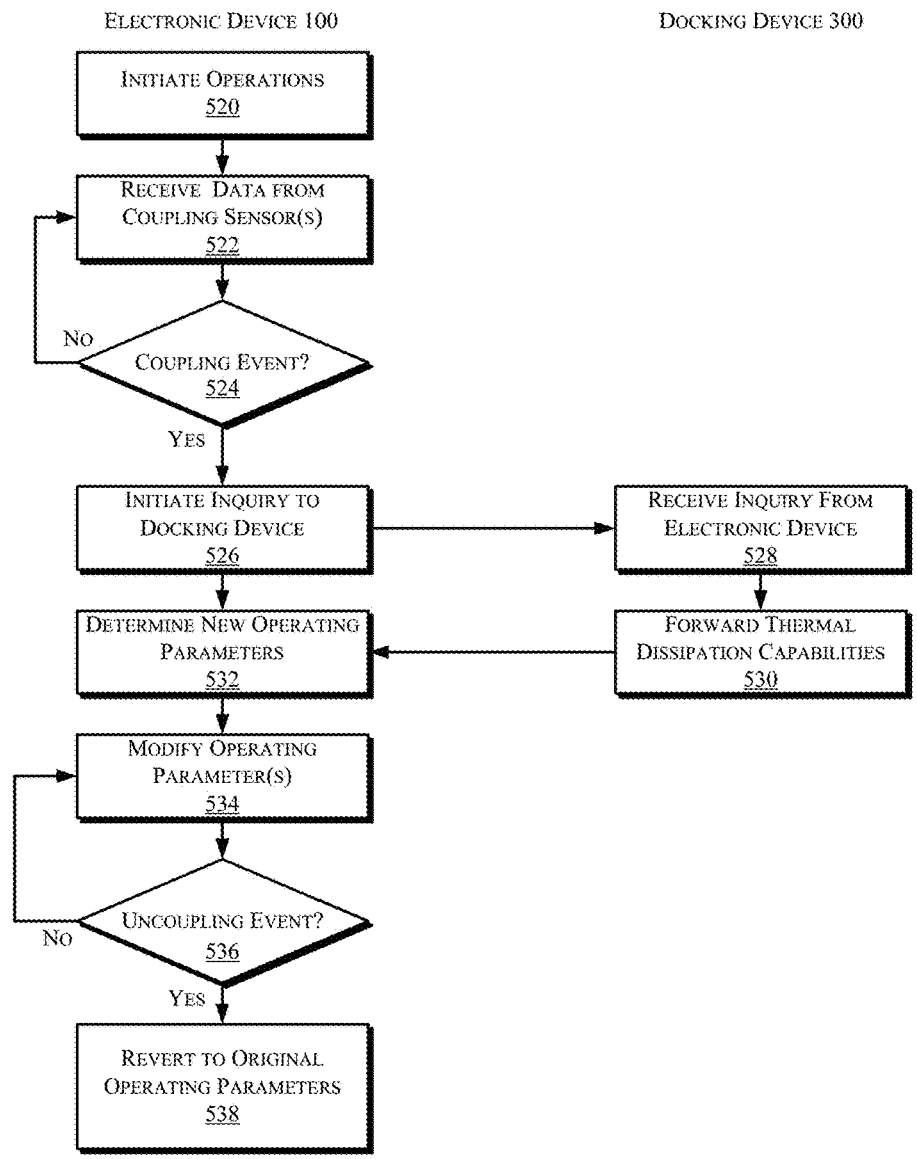

Referring to FIG. 5A, at operation 510 the electronic device 100 initiates operations using a first set of operating parameters. At operation 512 the power manager(s) 176 receive data from the position sensor(s) 432. If, at operation 514, the data from the position sensor(s) indicates that the second heat spreader 220 is retracted then control passes back to operation 512 and the power manager(s) 176 continue to monitor the data from the position sensors.

By contrast, if at operation 514 the data from the position sensor(s) 432 indicates that the second heat spreader 220 is not retracted (i.e., that the second heat spreader 220 is in the second position) then control passes to operation 516 and the power manager(s) 176 revise one or more operating parameters of the electronic device. By way of example, the power manager(s) may authorize the processor(s) 122 to operate at a higher processing frequency, one or more displays of the electronic device 100 to operate at a higher brightness level, etc. Further, in some examples the power manager(s) 176 can also control the cooling capability of the dock, either though fan speed control, etc. to provide the cooling required by the device.

Thus, the operations depicted in FIG. 5A enable the power manager(s) 176 to adjust one or more operating parameters of the electronic device and/or dock based at least in part on the position of the second heat shield 220.

In another example, the power manager(s) 176 may manage operating parameters of the electronic device 100 based at least in part on whether the electronic device 100 is coupled to the docking station 300. The operations depicted on the left side of the flowchart of FIG. 5B may be implemented by the power manager(s) 176, alone or in combination with other component of electronic device 100. The operations depicted on the right side of the flowchart of FIG. 5B may be implemented by a controller of the docking device 300

Referring to FIG. 5, at operation 520 the electronic device 100 initiates operations using a first set of operating parameters. For example, as described above, in some examples the BIOS of electronic system 100 may retrieve a set of operating parameters from the thermal platform table(s) 442 in memory 440 when electronic device 100 is booted.

At operation 522 the power manager(s) 176 receives data from the coupling sensor(s) 434. At operation 524 it is determined whether there was a coupling event. For example, if at operation 524 the output of the coupling sensor 434 indicates that the electronic device 100 has been coupled to the docking device 300 then the output of the coupling sensor 434 would indicate that a coupling event has taken place. In some examples the electronic device 100 may be coupled to the external device 300 via a standardized protocol such as a Universal Serial Bus (USB) connector or the like. If at operation 524 the output of the coupling sensor 434 indicates that that a coupling event has not occurred then control passes back to operation 522 and the power manager 176 continued to receive data from the coupling sensor(s) 434.

By contrast, if at operation 524 a coupling event is indicated then control passes to operation 526 and the power manager(s) 176 initiates an inquiry to the docking device 300 to request one or more thermal capabilities from the external device 300.

At operation 528 the external device 300 receives the inquiry from the electronic device 100 and at operation 530 the external device 300 forwards the thermal dissipation capabilities of the docking device 300 to the electronic device 100. For example, the docking device 300 may forward an indication that the docking device 300 comprises one or more fans capable to force air through the heat exchange block 224 of the second heat spreader 220.

The electronic device 100 receives the thermal dissipation capabilities from the external device 300 and at operation 532 the power manager 176 in the electronic device 100 determines one or more new operating parameters for the electronic device. By way of example, the power manager(s) may authorize the processor(s) 122 to operate at a higher processing frequency, one or more displays of the electronic device 100 to operate at a higher brightness level, etc. At operation 534 the new thermal platform may modify the operation of one or more components of electronic device 100 in response to increased thermal dissipation capacity provided by the external device 300.

At operation 536 it is determined whether there was an uncoupling event. For example, if at operation 536 the output of the coupling sensor 434 indicates that the electronic device 100 has been uncoupled from the docking device 300 then the output of the coupling sensor 434 would indicate that an uncoupling event has taken place. If at operation 536 the output of the coupling sensor 434 indicates that that an uncoupling event has not occurred then control passes back to operation 534 and the power manager(s) 176 continues operations using the operating parameters selected in operation 532.

By contrast, if at operation 536 an uncoupling event is indicated then control passes to operation 538 and the power manager(s) 176 reverts to the operating parameters for the electronic device 100 established in operation 520.

Thus, the structure and operations described herein enable the power manager(s) 176 to implement a dynamic power management algorithm for the electronic device 100 depending upon the heat dissipation capabilities available in the docking device 300 to dissipate heat from the electronic device 100. When the electronic device 100 is operating in a stand-alone environment it may operate according to a first set of operating parameters. However, when the electronic device 100 is coupled to an external heat dissipation device, e.g., in an docking device 300, then the device may be operating in accordance with a different thermal management algorithm.

Figure 6:
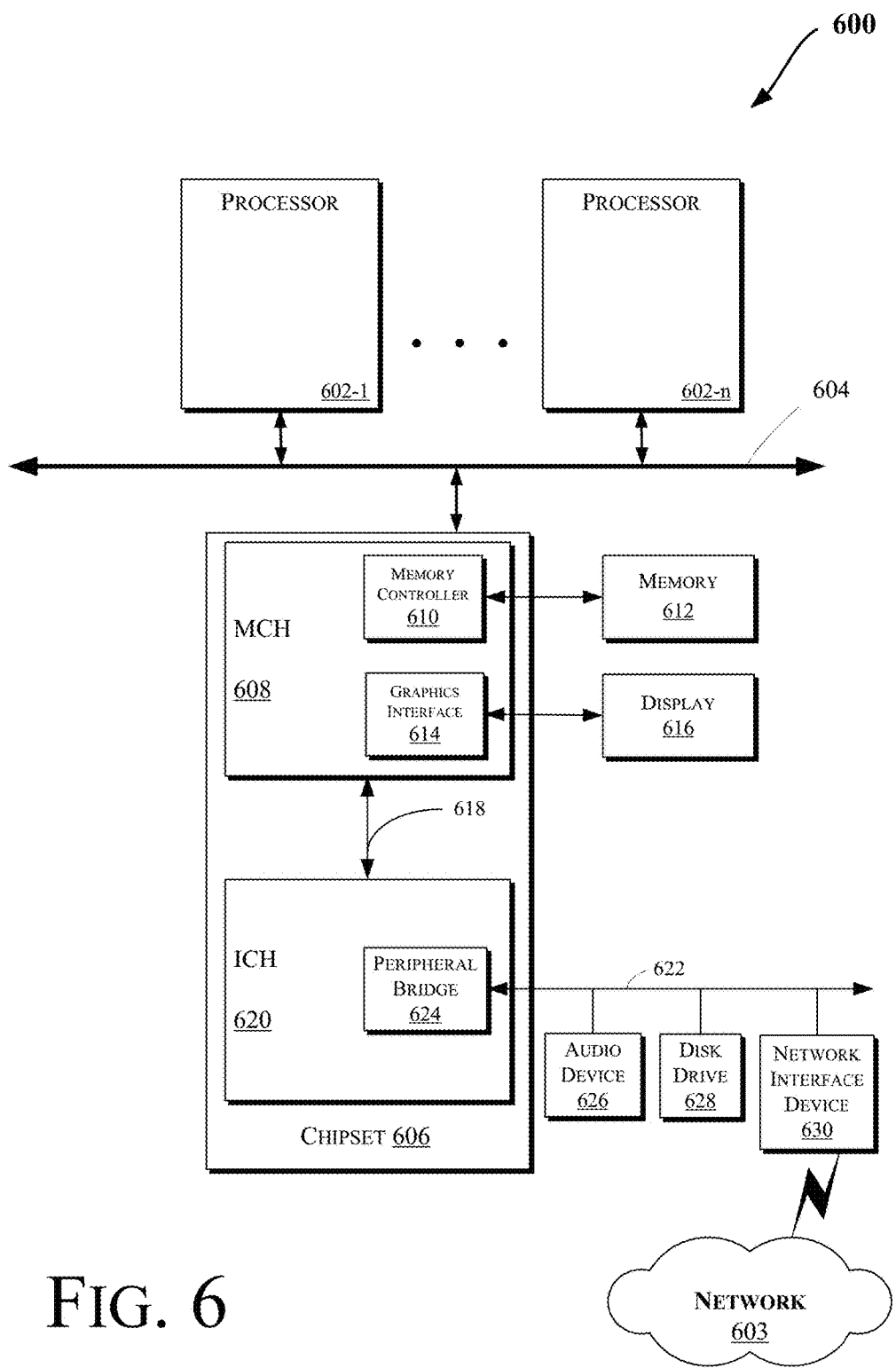
FIGS. 6-10 are schematic illustrations of electronic devices which may be adapted to include a retractable heat exchanger in accordance with some examples.

As described above, in some examples the electronic device may be embodied as an information processing system. FIG. 6 illustrates a block diagram of an information processing system 600 in accordance with an example. The information processing system 600 may include one or more central processing unit(s) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors.

A chipset 606 may also communicate with the interconnection network 604. The chipset 606 may include a memory control hub (MCH) 608. The MCH 608 may include a memory controller 610 that communicates with a memory 612. The memory 412 may store data, including sequences of instructions, that may be executed by the processor 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processor(s) and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the information processing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
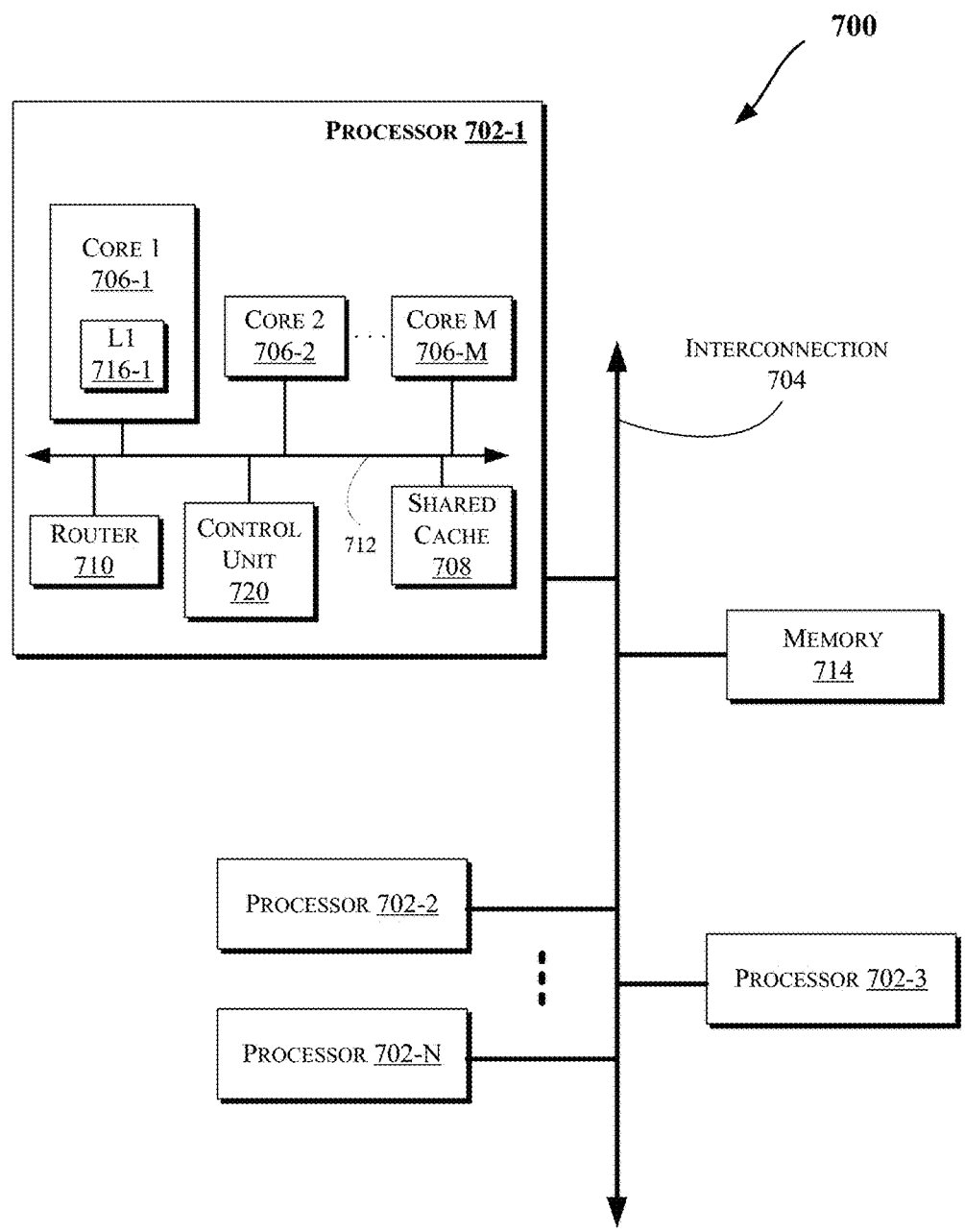

FIG. 7 illustrates a block diagram of an information processing system 700, according to an example. The information processing system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716").

Figure 8:
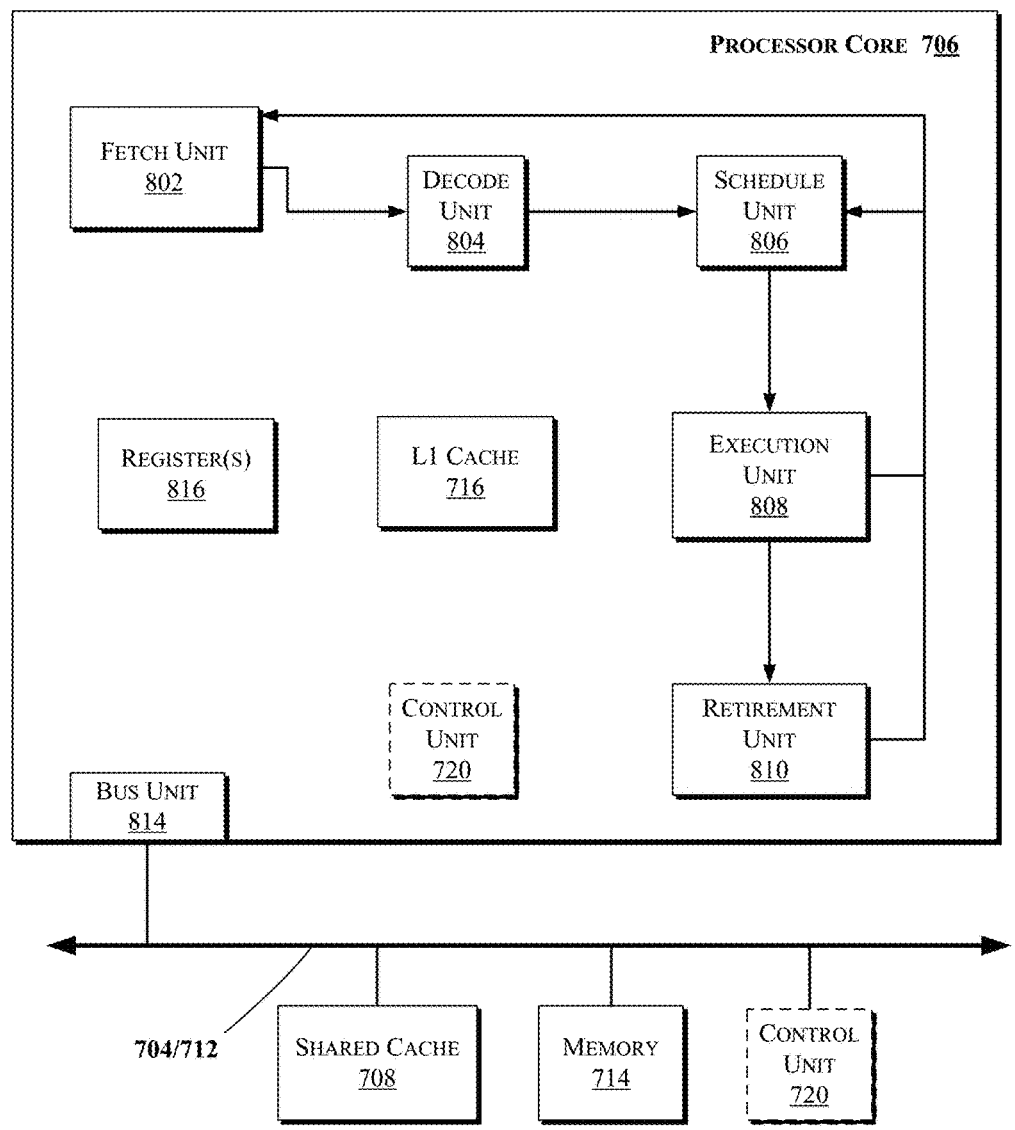

FIG. 8 illustrates a block diagram of portions of a processor core 706 and other components of an information processing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of micro-operations.

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various examples the control unit 720 may be located elsewhere such as inside the core 706, coupled to the core via bus 704, etc.

Figure 9:
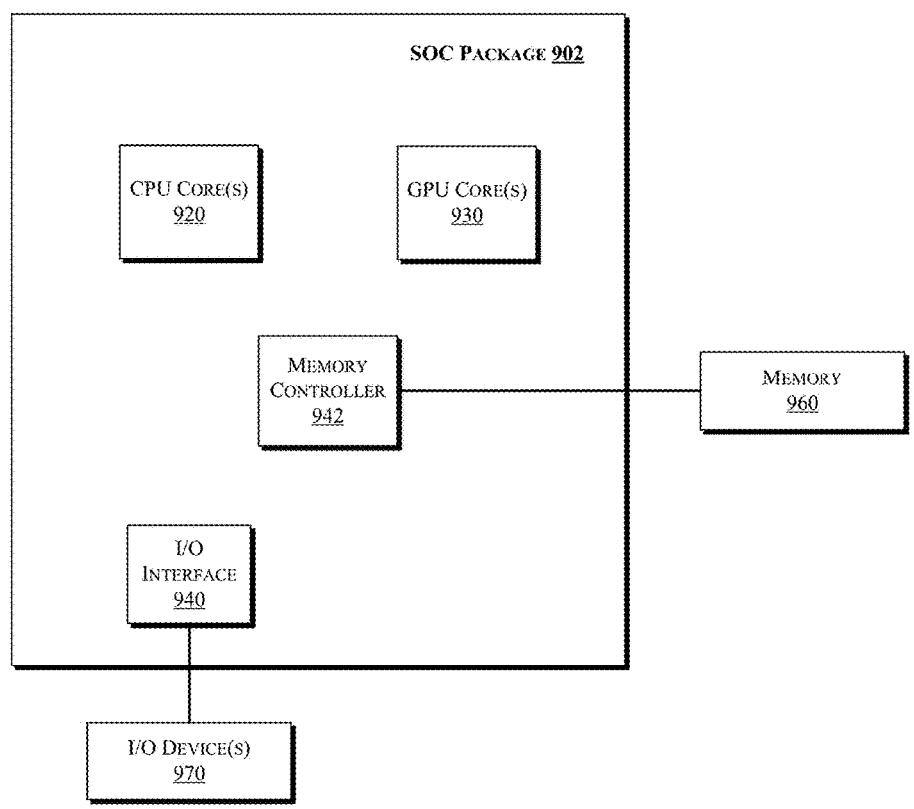

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more processor cores 920, one or more graphics processor cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures)

via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch surface, a speaker, or the like.

Figure 10:
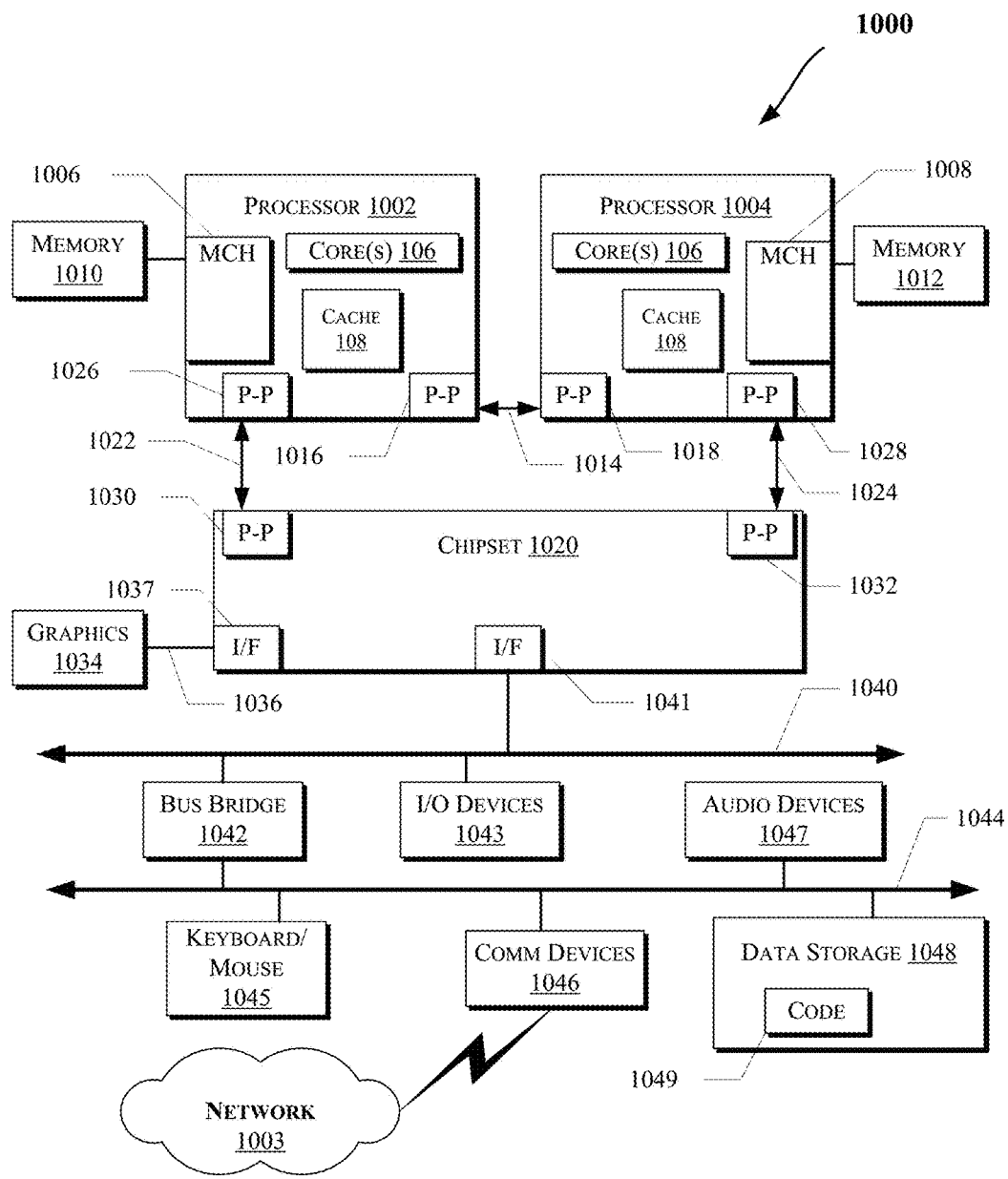

FIG. 10 illustrates an information processing system 1000 that is arranged in a point-to-point (PtP) configuration, according to an example. In particular, FIG. 10 shows a system where processors, memory, and input/output devices are interconnected by a number of point-to-point interfaces.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following pertain to further examples.

Example 1 is an electronic device, comprising a chassis, a processing device disposed in the chassis, a first heat spreader positioned adjacent the processing device and in thermal communication with the processing device, and a second heat spreader positioned adjacent the first heat spreader and in thermal communication with the first heat spreader, wherein the second heat spreader is moveable between a first position in which the second heat spreader is disposed within the chassis and a second position in which at least a portion of the second heat spreader extends outside the chassis.

In Example 2, the subject matter of Example 1 can optionally include an arrangement in which the first heat spreader is positioned in physical contact with the processing device.

In Example 3, the subject matter of any one of Examples 1-2 can optionally include an arrangement in which the second heat spreader comprises a plate section physically coupled to the first heat spreader and a heat exchange block depending from the plate section.

In Example 4, the subject matter of any one of Examples 1-3 can optionally include an arrangement in which the heat exchange block comprises a plurality of fins defining a plurality of apertures to permit airflow passage between the fins.

In Example 5, the subject matter of any one of Examples 1-4 can optionally include an arrangement in which the second heat spreader comprises a base plate depending from the heat exchange block.

In Example 6, the subject matter of any one of Examples 1-5 can optionally include an arrangement in which the first heat spreader comprises a tab; and the second heat spreader comprises an alignment slot to receive the tab.

In Example 7, the subject matter of any one of Examples 1-6 can optionally include a power manager comprising logic, at least partially including hardware logic, to determine whether the second heat spreader is in the first position or the second position; and adjust an operating parameter of the processing device in response to a determination that the second heat spreader is in the first position or the second position.

In Example 8, the subject matter of any one of Examples 1-7 can optionally include an arrangement wherein the power manager comprises logic, at least partially including hardware logic, to determine a temperature proximate the processing device disposed in the chassis and adjust an operating parameter of the processing device in response to the temperature.

In Example 9, the subject matter of any one of Examples 1-8 can optionally include an arrangement wherein the power manager comprises logic, at least partially including hardware logic, to receive a signal indicating that the electronic device is coupled to an external docking device; receive thermal dissipation capabilities from the external docking device; and adjust an operating parameter of the processing device in response to the thermal dissipation capabilities.

In Example 10, the subject matter of any one of Examples 1-9 can optionally include an arrangement wherein the power manager comprises logic, at least partially including hardware logic, to receive a signal indicating that the electronic device is uncoupled from the external docking device; and adjust an operating parameter of the processing device in response to the signal.

Example 11 is a heat dissipation assembly for an electronic device, comprising a first heat spreader positioned adjacent a processing device in the electronic device and in thermal communication with the processing device; and a second heat spreader positioned adjacent the first heat spreader and in thermal communication with the first heat spreader; wherein the second heat spreader is moveable between a first position in which the second heat spreader is disposed within a chassis of the electronic device and a second position in which at least a portion of the second heat spreader extends outside the chassis.

In Example 12, the subject matter of Example 11 can optionally include an arrangement wherein the first heat spreader is positioned in physical contact with the processing device.

In Example 13 the subject matter of any one of Examples 11-12 can optionally include an arrangement wherein the second heat spreader comprises a plate section physically coupled to the first heat spreader; and a heat exchange block depending from the plate section.

In Example 14, the subject matter of any one of Examples 11-13 can optionally include an arrangement wherein wherein the heat exchange block comprises a plurality of fins defining a plurality of apertures to permit airflow passage between the fins.

In Example 15, the subject matter of any one of Examples 11-14 can optionally include an arrangement wherein the second heat spreader comprises a base plate depending from the heat exchange block.

In Example 16, the subject matter of any one of Examples 11-15 can optionally include an arrangement wherein the first heat spreader comprises a tab; and the second heat spreader comprises an alignment slot to receive the tab.

Example 17 is a controller for an electronic device comprising logic, at least partly including hardware logic, to monitor a heat dissipation assembly for an electronic device, the heat dissipation assembly comprising a first heat spreader positioned adjacent a processing device in the electronic device and in thermal communication with the processing device; and a second heat spreader positioned adjacent the first heat spreader and in thermal communication with the first heat spreader; wherein the second heat spreader is moveable between a first position in which the second heat spreader is disposed within a chassis of the electronic device and a second position in which at least a portion of the second heat spreader extends outside the chassis; determine whether the second heat spreader is in the first position or the second position; and adjust an operating parameter of the processing device in response to a determination that the second heat spreader is in the first position or the second position.

In Example 18, the subject matter of Example 17 can optionally include logic, at least partly including hardware logic, to determine a temperature proximate the processing device disposed in the chassis; and adjust an operating parameter of the processing device in response to the temperature.

In Example 19, the subject matter of any one of Examples 17-18 can optionally include logic, at least partly including hardware logic, to receive a signal indicating that the electronic device is coupled to an external docking device; receive thermal dissipation capabilities from the external docking device; and adjust an operating parameter of the processing device in response to the thermal dissipation capabilities.

In Example 20, the subject matter of any one of Examples 17-19 can optionally include logic, at least partially including hardware logic, configured to receive a signal indicating that the electronic device is uncoupled from the external docking device; and adjust an operating parameter of the processing device in response to the signal.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and examples are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and examples are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and examples are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular examples, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one example" or "some examples" means that a particular feature, structure, or characteristic described in connection with the example is included in at least an implementation. The appearances of the phrase "in one example" in various places in the specification may or may not be all referring to the same example.

Although examples have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An electronic device, comprising:
    a chassis;
    a processing device disposed in the chassis;
    a first heat spreader comprising a tab and mounted to the chassis such that the first heat spreader is in direct physical contact with the processing device and in thermal communication with the processing device; and
    a second heat spreader comprising an alignment slot to receive the tab and at least one additional slot to receive a screw which is secured to the first heat spreader, the second heat spreader positioned adjacent the first heat spreader and in thermal communication with the first heat spreader;
    wherein the second heat spreader is slideably engaged with the first heat spreader and is moveable between a first position in which the second heat spreader is disposed within the chassis and a second position in which at least a portion of the second heat spreader extends outside the chassis, the first position and the second position defining a range of motion for the second heat spreader delimited by a length of the at least one additional slot in the second heat spreader.

2. The electronic device of claim 1, wherein the second heat spreader comprises:
   a plate section physically coupled to the first heat spreader; and
   a heat exchange block depending from the plate section.

3. The electronic device of claim 2, wherein the heat exchange block comprises a plurality of fins defining a plurality of apertures to permit airflow passage between the fins.

4. The electronic device of claim 3, wherein the second heat spreader comprises:
   a base plate depending from the heat exchange block.

5. The electronic device of claim 1, wherein the electronic device comprises:
   a power manager comprising logic, at least partially including hardware logic, to:
      determine whether the second heat spreader is in the first position or the second position; and
      adjust an operating parameter of the processing device in response to a determination that the second heat spreader is in the first position or the second position.

6. The electronic device of claim 5, wherein the power manager comprises the logic, at least partially including the hardware logic, to:
   determine a temperature proximate the processing device disposed in the chassis; and
   adjust the operating parameter of the processing device in response to the temperature.

7. The electronic device of claim 6, wherein the power manager comprises the logic, at least partially including the hardware logic, to:
   receive a signal indicating that the electronic device is coupled to an external docking device;
   receive thermal dissipation capabilities from the external docking device; and
   adjust the operating parameter of the processing device in response to the thermal dissipation capabilities.

8. The electronic device of claim 5, wherein the power manager comprises the logic, at least partially including the hardware logic, to:
   receive a signal indicating that the electronic device is uncoupled from the external docking device; and
   adjust the operating parameter of the processing device in response to the signal.

9. A heat dissipation assembly for an electronic device, comprising:
   a first heat spreader comprising a tab and mounted to a chassis of the electronic device such that the first heat spreader is in direct physical contact with a processing device of the electronic device and in thermal communication with the processing device; and
   a second heat spreader comprising an alignment slot to receive the tab and at least one additional slot to receive a screw which is secured to the first heat spreader, the second heat spreader positioned adjacent the first heat spreader and in thermal communication with the first heat spreader;
   wherein the second heat spreader is slideably engaged with the first heat spreader and is moveable between a first position in which the second heat spreader is disposed within the chassis of the electronic device and a second position in which at least a portion of the second heat spreader extends outside the chassis, the first position and the second position defining a range of motion for the second heat spreader delimited by a length of the at least one additional slot in the second heat spreader.

10. The heat dissipation assembly of claim 9, wherein the second heat spreader comprises:
    a plate section physically coupled to the first heat spreader; and
    a heat exchange block depending from the plate section.

11. The heat dissipation assembly of claim 10, wherein the heat exchange block comprises a plurality of fins defining a plurality of apertures to permit airflow passage between the fins.

12. The heat dissipation assembly of claim 11, wherein the second heat spreader comprises:
    a base plate depending from the heat exchange block.

13. A controller for an electronic device comprising logic, at least partly including hardware logic, to:
    monitor a heat dissipation assembly for an electronic device, the heat dissipation assembly comprising:
    a first heat spreader comprising a tab and mounted to a chassis such that the first heat spreader is in direct physical contact with a processing device and in thermal communication with the processing device; and
    a second heat spreader comprising an alignment slot to receive the tab and at least one additional slot to receive a screw which is secured to the first heat spreader, the second heat spreader and positioned adjacent the first heat spreader and in thermal communication with the first heat spreader;
    wherein the second heat spreader is slideably engaged with the first heat spreader and is moveable between a first position in which the second heat spreader is disposed within the chassis of the electronic device and a second position in which at least a portion of the second heat spreader extends outside the chassis, the first position and the second position defining a range of motion for the second heat spreader delimited by a length of the at least one additional slot in the second heat spreader;
    determine whether the second heat spreader is in the first position or the second position; and
    adjust an operating parameter of the processing device in response to a determination that the second heat spreader is in the first position or the second position.

14. The controller of claim 13, further comprising the logic, at least partially including the hardware logic, to:
    determine a temperature proximate the processing device disposed in the chassis; and
    adjust the operating parameter of the processing device in response to the temperature.

15. The controller of claim 13, further comprising the logic, at least partially including hardware logic, to:
    receive a signal indicating that the electronic device is coupled to an external docking device;
    receive thermal dissipation capabilities from the external docking device; and
    adjust the operating parameter of the processing device in response to the thermal dissipation capabilities.

16. The controller of claim 15, further comprising the logic, at least partially including the hardware logic, to:
    receive a signal indicating that the electronic device is uncoupled from the external docking device; and
    adjust the operating parameter of the processing device in response to the signal.

* * * * *